(12) United States Patent
Ishibashi

(10) Patent No.: US 10,283,464 B2
(45) Date of Patent: May 7, 2019

(54) ELECTRONIC DEVICE AND MANUFACTURING METHOD OF ELECTRONIC DEVICE

(71) Applicant: FUJITSU LIMITED, Kawasaki-shi, Kanagawa (JP)

(72) Inventor: Daijiro Ishibashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/019,004

(22) Filed: Jun. 26, 2018

(65) Prior Publication Data

US 2019/0019767 A1  Jan. 17, 2019

(30) Foreign Application Priority Data

Jul. 11, 2017  (JP) .................................. 2017-135647

(51) Int. Cl.
  *H01L 23/66*  (2006.01)
  *H01L 23/31*  (2006.01)
  (Continued)

(52) U.S. Cl.
  CPC .......... *H01L 23/66* (2013.01); *H01L 23/3185* (2013.01); *H01L 23/5226* (2013.01); *H01L 23/5286* (2013.01); *H01L 24/02* (2013.01); *H01L 2223/6627* (2013.01); *H01L 2224/02331* (2013.01); *H01L 2224/02379* (2013.01); *H01L 2224/02381* (2013.01)

(58) Field of Classification Search
  CPC ............. H01L 23/3185; H01L 23/5226; H01L 23/5286; H01L 23/66; H01L 24/02; H01L 2223/6627; H01L 2224/02331; H01L 2224/02379; H01L 2224/02381
  See application file for complete search history.

(56) References Cited

U.S. PATENT DOCUMENTS

| 5,184,095 A | * | 2/1993 | Hanz | H01L 23/64 333/238 |
| 6,043,556 A | * | 3/2000 | Tomie | H01L 23/66 257/664 |

(Continued)

FOREIGN PATENT DOCUMENTS

| JP | 08-078797 | 3/1996 |
| JP | 2000-243754 | 9/2000 |
| JP | 2011-155042 | 8/2011 |

*Primary Examiner* — Allan R Wilson
(74) *Attorney, Agent, or Firm* — Fujitsu Patent Center

(57) ABSTRACT

An electronic device includes a semiconductor device including a semiconductor chip, a first grounded layer formed on a surface of the semiconductor chip, a mold resin arranged on a side of the semiconductor device, an insulating layer arranged over the semiconductor device and the mold resin, a second grounded layer formed between the semiconductor device and the insulating layer, and the resin mold and the insulating layer, a second wiring layer formed over the insulating layer and includes a first area disposed at a part overlapping with the second grounded layer and a second area disposed on a side of an end part of the second grounded layer, a via that couples the first wiring layer and the second area of the second wiring layer, and a grounded conductor formed inside the insulating layer at a position overlapping with the second area of the second wiring layer.

6 Claims, 9 Drawing Sheets

(51) Int. Cl.
*H01L 23/528* (2006.01)
*H01L 23/522* (2006.01)
*H01L 23/00* (2006.01)

(56) References Cited

U.S. PATENT DOCUMENTS

| | | | | |
|---|---|---|---|---|
| 8,102,036 | B2* | 1/2012 | Kashiwabara | H01L 23/64 257/664 |
| 9,462,709 | B2* | 10/2016 | Kawazu | H01L 23/055 |
| 2003/0030516 | A1* | 2/2003 | Tsukiyama | H01L 23/66 333/247 |
| 2011/0128100 | A1* | 6/2011 | Ohhira | H01P 1/047 |
| 2012/0061133 | A1* | 3/2012 | Masuda | H01L 23/057 174/261 |
| 2014/0145883 | A1* | 5/2014 | Baks | H01Q 1/2283 343/700 MS |

* cited by examiner

ELECTRONIC DEVICE AND MANUFACTURING METHOD OF ELECTRONIC DEVICE

CROSS-REFERENCE TO RELATED APPLICATION

This application is based upon and claims the benefit of priority of the prior Japanese Patent Application No. 2017-135647, filed on Jul. 11, 2017, the entire contents of which are incorporated herein by reference.

FIELD

The embodiment discussed herein is related to an electronic device and a manufacturing method of an electronic device.

BACKGROUND

As a related art, there is a substrate for high-frequency device mounting fabricated as follows. The substrate is formed by stacking an upper insulating layer over a lower insulating layer with the intermediary of a ground layer. Through-holes are opened in the ground layer. The inner diameter of the through-holes is set to a small diameter to lower the characteristic impedance of conductor line parts loosely inserted in the through-holes. The lower insulating layer is formed with a large thickness to raise the characteristic impedance of conductor line parts formed to vertically penetrate the lower insulating layer. Furthermore, matching of the characteristic impedance of conductor lines to a predetermined value is carried out. Signal lines are made on the upper insulating layer. The signal lines are coupled to the conductor lines and constitute a microstrip line with the ground layer.

In the related-art substrate for high-frequency device mounting, adjustment of the characteristic impedance is not carried out at the coupling parts between the conductor lines and the signal lines. For example, if the frequency is as high as 100 GHz to several hundreds of GHz or higher, the importance of adjustment of the characteristic impedance at the coupling parts is high. If the characteristic impedance is not set to the desired value, the operation characteristics of the electronic device deteriorate.

The following is a reference document. [Document 1] Japanese Laid-open Patent Publication No. 08-078797.

SUMMARY

According to an aspect of the embodiment, an electronic device includes a semiconductor device including a semiconductor chip, a first grounded layer formed on a surface of the semiconductor chip, and a first wiring layer that constitutes a first transmission line that has a predetermined characteristic impedance with the first grounded layer, a mold resin arranged on a side of the semiconductor device, an insulating layer arranged over the semiconductor device and the mold resin, a second grounded layer formed between the semiconductor device and the insulating layer, and the resin mold and the insulating layer, a second wiring layer formed over the insulating layer and includes a first area disposed at a part overlapping with the second grounded layer and a second area disposed on a side of an end part of the second grounded layer, the first area including a first line width and constituting a second transmission line including a predetermined characteristic impedance equal to the characteristic impedance of the first transmission line with the second grounded layer, the second area including a second line width smaller than the first line width, a via that couples the first wiring layer and the second area of the second wiring layer, and a grounded conductor formed inside the insulating layer at a position overlapping with the second area of the second wiring layer and includes a larger width than the second area in a line width direction of the second area, the grounded conductor extending from the second grounded layer to a position short of the second area along the via.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An electronic device and a manufacturing method of an electronic device according to an embodiment of the present disclosure will be described below.

Embodiment

Figure 1:
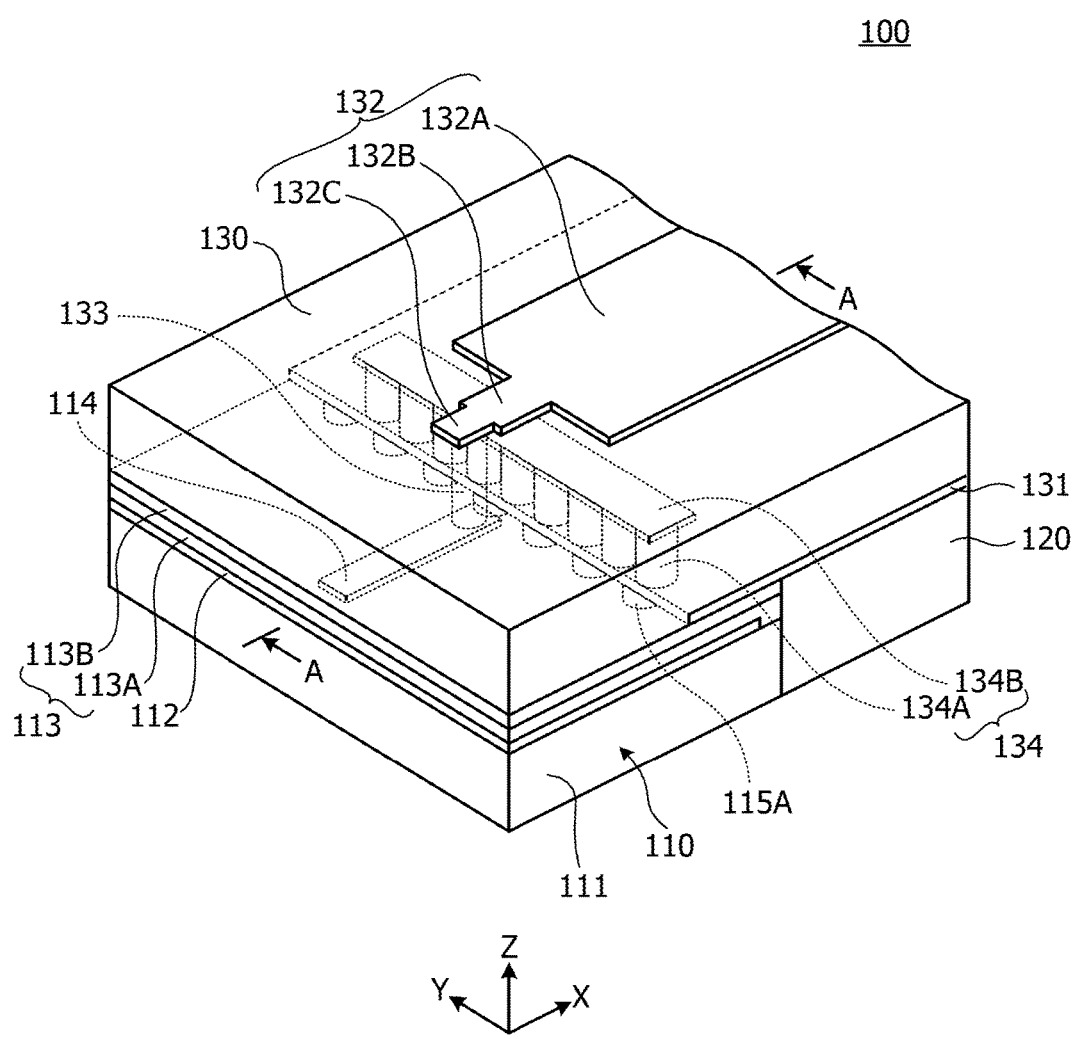
FIG. 1 is a perspective view depicting an electronic device of an embodiment.
Figure 2:
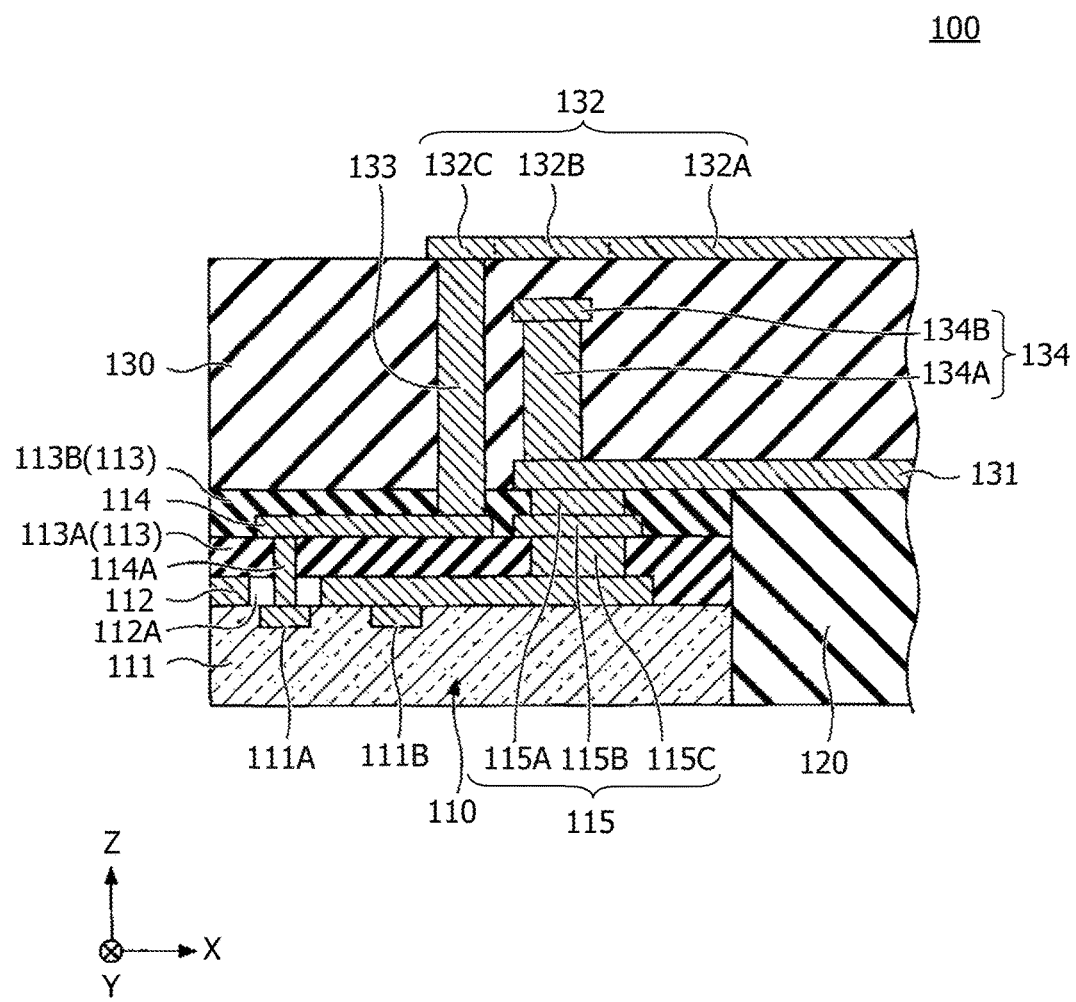
FIG. 2 is a diagram illustrating a section along line A-A in FIG. 1 as viewed in a direction of arrows.
Figure 3:
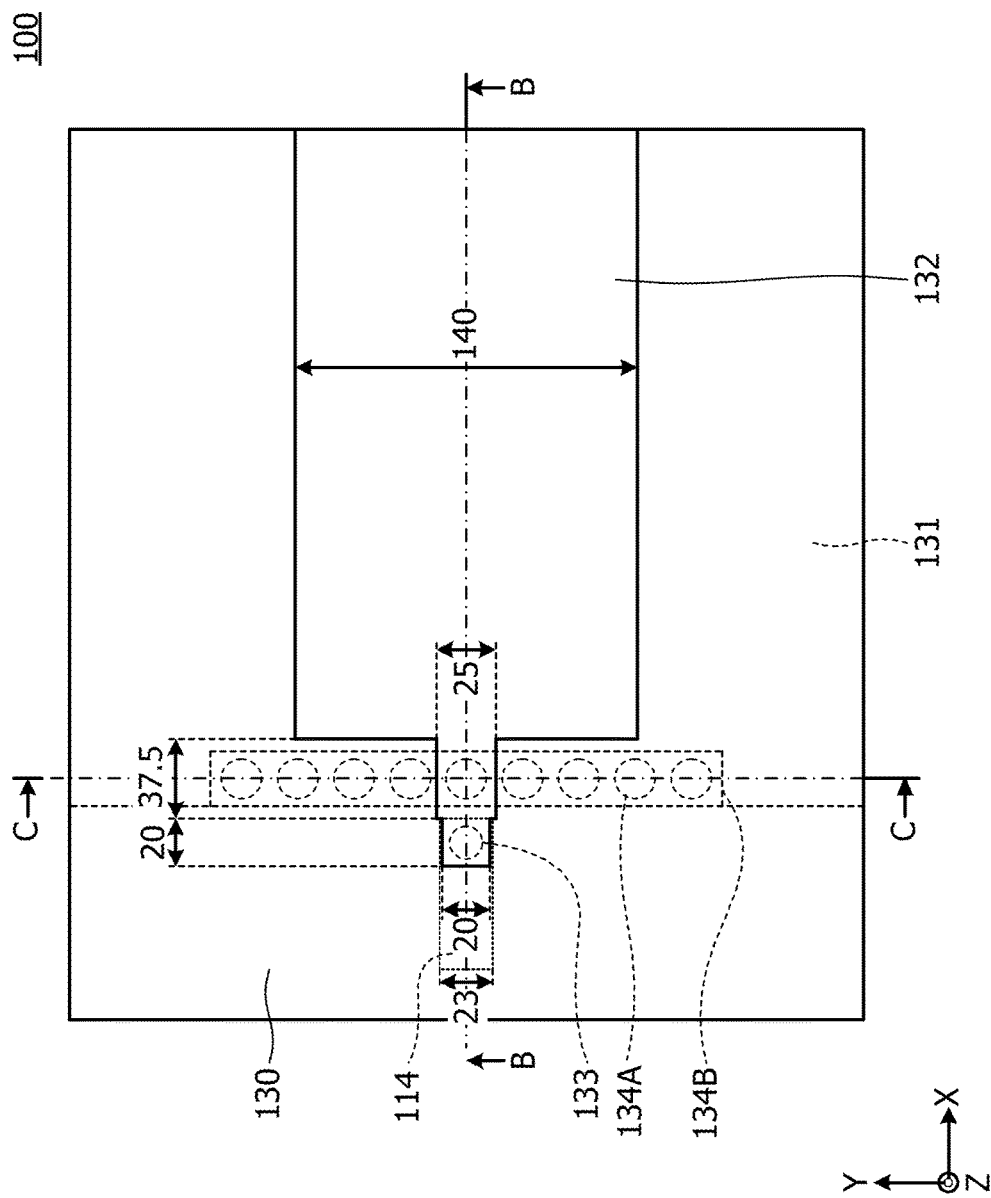
FIG. 3 is a plan view illustrating an electronic device.
Figure 4:
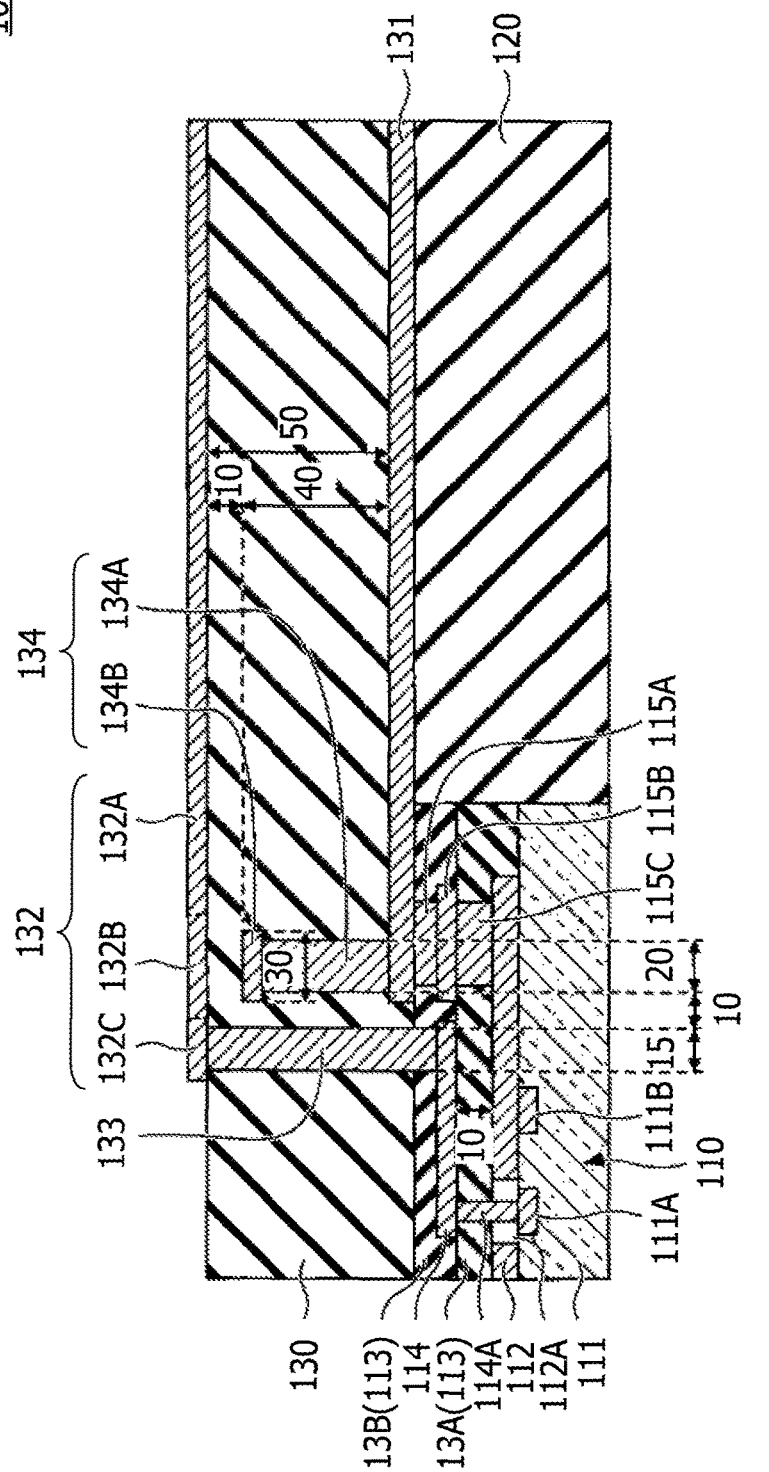
FIG. 4 is a diagram illustrating a section along line B-B in FIG. 3 as viewed in a direction of arrows.
Figure 5:
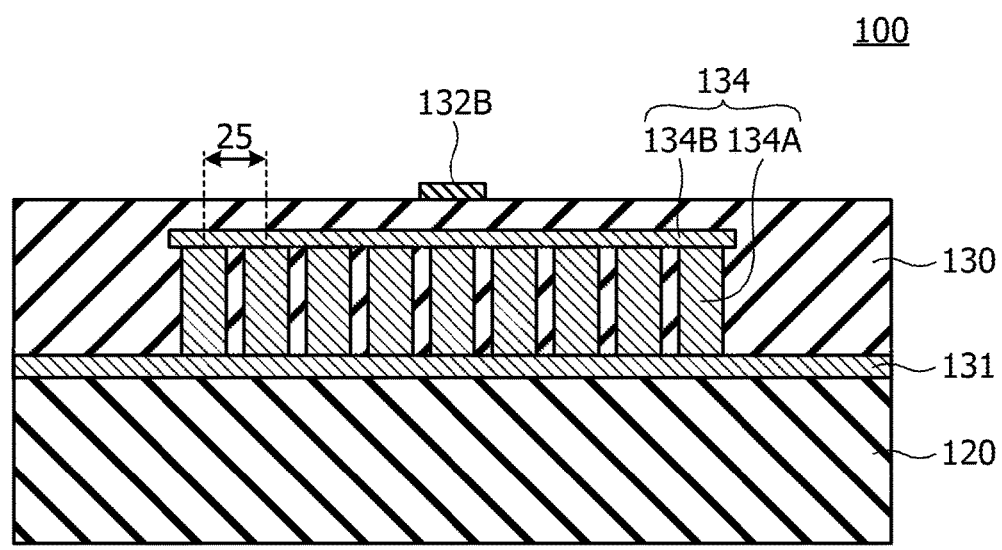
FIG. 5 is a diagram illustrating a section along line C-C in FIG. 3 as viewed in a direction of arrows.

FIG. 1 is a perspective view illustrating an electronic device of an embodiment. FIG. 2 is a diagram illustrating a section along line A-A in FIG. 1 as viewed in a direction of arrows. FIG. 3 is a plan view illustrating an electronic device. FIG. 4 is a diagram illustrating a section along line B-B in FIG. 3 as viewed in a direction of arrows. FIG. 5 is a diagram illustrating a section along line C-C in FIG. 3 as viewed in a direction of arrows. With FIG. 1 to FIG. 5, description will be made with a XYZ coordinate system defined. Furthermore, the unit of numerical values that express the dimensions of the respective parts represented as one example in FIG. 3 to FIG. 5 is μm. The section illustrated in FIG. 4 is the same as the section illustrated in FIG. 2 and is obtained by adding the dimensions. Hereinafter, for convenience of explanation, the Z-axis positive direction side is defined as the upper side and the Z-axis negative direction side is defined as the lower side. However, this does not represent the universal relationship between the upper and lower sides.

An electronic device 100 includes a semiconductor device 110, a mold resin 120, an insulating layer 130, a grounded layer 131, a wiring layer 132, a via 133, and a grounded conductor 134. The electronic device 100 is obtained as follows. Plural semiconductor chips, electronic elements, and so forth are formed on a wafer and wiring layers and so forth are formed by a semiconductor manufacturing technique. Then, the wafer is turned to individual pieces to fabricate semiconductor chips, chip components, and so forth, and the semiconductor chips, the chip components, and so forth are reconstructed into a wafer shape by the mold resin 120. Then, the wafer is turned to individual pieces again and redistribution is carried out. The electronic device 100 may further include a chip component such as a capacitor or an inductor in addition to the semiconductor device 110.

The electronic device 100 is a module using a fan out wafer level package (FOWLP) technique and allows wiring layers and so forth to be directly coupled to terminals of semiconductor chip, electronic element, and so forth without using bumps.

The semiconductor device 110 includes a semiconductor chip 111, a grounded layer 112, an insulating layer 113 (113A and 113B), a wiring layer 114, and a via 115. The semiconductor chip 111 is formed on a silicon wafer as one example and includes a circuit and so forth that execute arithmetic processing, control processing, or the like. The wiring layer 114 and the grounded layer 112 are coupled to a signal terminal 111A and a ground terminal 111B, respectively, existing on the surface of the semiconductor chip 111 on the Z-axis positive direction side.

The wiring layer 114 is coupled to the signal terminal 111A through solder 114A set in an opening 112A of the grounded layer 112. The opening 112A is an opening having a circular shape in plan view. Furthermore, the grounded layer 112 is directly coupled to the ground terminal 111B. Incidentally, the grounded layer 112 may be coupled to the ground terminal 111B by using solder.

The grounded layer 112 is disposed on the surface of the semiconductor chip 111 on the Z-axis positive direction side and is formed by a semiconductor manufacturing technique. The grounded layer 112 is one example of a first grounded layer. The width of the grounded layer 112 is larger than the width of the wiring layer 114 in plan view. As one example, the grounded layer 112 is made across the whole width of the semiconductor device 110 in the Y-axis direction.

The grounded layer 112 is coupled to the ground terminal 111B of the semiconductor chip 111 and is held at a ground potential. The via 115 is coupled to the end part of the grounded layer 112 on the X-axis positive direction side. The upper surface and side surface of the grounded layer 112 are covered by the insulating layer 113A in the insulating layer 113.

The insulating layer 113 includes the insulating layers 113A and 113B. The insulating layer 113 is one example of a chip insulating layer. The insulating layer 113A covers the grounded layer 112 and the wiring layer 114 is disposed on the insulating layer 113A. The insulating layer 113A is a polyimide resin, for example, and is an interlayer insulating film that insulates the grounded layer 112 and the wiring layer 114 from each other.

The insulating layer 113B is disposed on the wiring layer 114 and covers the wiring layer 114. The insulating layer 113B is solder resist, for example. The upper surface of the insulating layer 113B is the upper surface of the semiconductor device 110. The insulating layer 113B is one example of a protective insulating layer.

The wiring layer 114 is formed on the upper surface of the insulating layer 113A. The wiring layer 114 is one example of a first wiring layer. One end of the wiring layer 114 is coupled to the signal terminal 111A of the semiconductor chip 111 and the other end is coupled to the via 133. The wiring layer 114 is formed by a semiconductor manufacturing technique. The wiring layer 114 constitutes a microstrip line with the grounded layer 112. The characteristic impedance of the wiring layer 114 is set to 50 Q as one example. The microstrip line constituted by the wiring layer 114 and the grounded layer 112 is one example of a first transmission line.

The via 115 includes a via 115A, a coupling part 115B, and a via 115C. The via 115 is formed by a semiconductor manufacturing technique. The lower end of the via 115 is coupled to the end part of the grounded layer 112 on the X-axis positive direction side and the upper end is coupled to the end part of the grounded layer 131 on the X-axis negative direction side. The via 115 is made in order to hold the grounded layer 131 at the ground potential.

The mold resin 120 covers a side surface of the semiconductor device 110. The mold resin 120 is used in order to reconstruct semiconductor chips, chip components, and so forth into a wafer shape. The mold resin 120 is obtained by mixing spherical silica fillers (filling material) in an epoxy-based resin, for example. The mold resin 120 may cover the upper surface of the semiconductor device 110 in addition to the side surface.

The insulating layer 130 is disposed on the whole of the semiconductor device 110 and the grounded layer 131. The insulating layer 130 is an interlayer insulating film that insulates the grounded layer 131 and the wiring layer 132 as redistribution layers from each other. Furthermore, the via 133 and the grounded conductor 134 are made in the insulating layer 130. It suffices for the insulating layer 130 to be made of an insulating material whose dielectric loss tangent is low, and a film-shaped non-photosensitive material of a polyphenylene ether-based material may be used, for example.

The grounded layer 131 is disposed on the end part of the semiconductor device 110 on the X-axis positive direction side and the mold resin 120. The width of the grounded layer 131 is larger than the width of the wiring layer 132 in plan view. As one example, the grounded layer 131 is made across the whole width of the semiconductor device 110 and the mold resin 120 in the Y-axis direction. Furthermore, the end part of the grounded layer 131 on the X-axis negative direction side is close to the via 133 and the grounded conductor 134 is made on the upper surface of the end part on the X-axis negative direction side. The grounded layer 131 is one example of a second grounded layer.

The wiring layer 132 is made on the insulating layer 130. The wiring layer 132 includes a main conductor part 132A and wiring layer parts 132B and 132C. The wiring layer 132 is one example of a second wiring layer. The main conductor part 132A is one example of a first part. The wiring layer parts 132B and 132C are one example of a second part.

The main conductor part 132A extends from the end of the insulating layer 130 on the X-axis positive direction side to a position short of the grounded conductor 134 in plan view and is made to overlap with the grounded layer 131 with the intermediary of the insulating layer 130. Furthermore, the width of the main conductor part 132A is larger than the width of the wiring layer parts 132B and 132C and is one example of a first line width. The main conductor part 132A constitutes a microstrip line with the grounded layer 131. The microstrip line constituted by the main conductor part 132A and the grounded layer 131 is one example of a second transmission line. The characteristic impedance of the main conductor part 132A is set to 50 Q as one example.

The wiring layer parts 132B and 132C are made to protrude from the end part of the main conductor part 132A on the X-axis negative direction side. The width of the wiring layer parts 132B and 132C is smaller than the width of the main conductor part 132A and is one example of a second line width. Furthermore, the position of the wiring layer parts 132B and 132C in the Y-axis direction is aligned with the position of the wiring layer 114.

The wiring layer part 132B is located above a coupling part 134B of the grounded conductor 134. The wiring layer part 132B constitutes a microstrip line with the coupling part 134B (grounded conductor 134). The wiring layer part 132B slightly extends, in the X-axis direction, toward the X-axis positive direction side relative to the end of the coupling part 134B on the X-axis positive direction side in order to weaken the coupling between the main conductor part 132A and the coupling part 134B (grounded conductor 134).

Furthermore, in the X-axis direction, the wiring layer part 132B slightly extends toward the X-axis negative direction side relative to the end of the coupling part 134B on the X-axis negative direction side. The purpose of this is to extend the range in which the wiring layer part 132B may constitute the microstrip line with the coupling part 134B (grounded conductor 134) toward the X-axis negative direction side. Furthermore, the wiring layer part 132C is made at the tip of the wiring layer part 132B.

The wiring layer part 132C is coupled to the upper end of the via 133. The width of the wiring layer part 132C is set slightly smaller than the width of the wiring layer part 132B in order to adjust the impedance. The wiring layer part 132C constitutes the microstrip line with the coupling part 134B (grounded conductor 134) similarly to the part, in the wiring layer part 132B, slightly extending toward the X-axis negative direction side relative to the end of the coupling part 134B on the X-axis negative direction side.

The characteristic impedance of the microstrip line constituted by the wiring layer parts 132B and 132C and the coupling part 134B (grounded conductor 134) is set to 50 Q as one example. The microstrip line constituted by the wiring layer parts 132B and 132C and the coupling part 134B (grounded conductor 134) is one example of a fourth transmission line.

The via 133 penetrates the insulating layer 113B and the insulating layer 130 in the thickness direction (Z-axis direction) and couples the end part of the wiring layer 114 on the X-axis positive direction side and the wiring layer part 132C. The via 133 constitutes a microstrip line with the via 115A, the coupling part 115B, and the grounded conductor 134. The part higher than the grounded conductor 134 in the via 133 also constitutes the microstrip line with the grounded conductor 134. The microstrip line constituted by the via 133 and the via 115A, the coupling part 115B, and the grounded conductor 134 is one example of a third transmission line.

The grounded conductor 134 is vertically made to stand upright in the Z-axis positive direction at the end part of the grounded layer 131 on the X-axis negative direction side. The grounded conductor 134 includes plural circular column parts 134A and the coupling part 134B that couples the upper ends of the plural circular column parts 134A.

The plural circular column parts 134A are arranged in the Y-axis direction. Here, nine circular column parts 134A are illustrated as one example. The lower ends of the plural circular column parts 134A are coupled to the grounded layer 131 and the upper ends are coupled by the coupling part 134B. The coupling part 134B couples the upper ends of the plural circular column parts 134A and extends in the Y-axis direction. The circular column parts 134A are one example of a columnar part.

Such a grounded conductor 134 is made in order to constitute a microstrip line with an inverted L-shape in XZ-plan view with the via 133 and the wiring layer parts 132B and 132C as described above. The grounded conductor 134 constructed by the nine circular column parts 134A and the coupling part 134B is equivalent to the existence of one wall part held at the ground potential.

Here, the dimensions of the respective parts will be described by using FIG. 3 to FIG. 5. As illustrated in FIG. 4, the gap between the grounded layer 112 and the wiring layer 114 in the Z-axis direction is 10 μm. The thickness of the insulating layer 130 is 50 μm. For example, the gap between the grounded layer 131 and the wiring layer 132 in the Z-axis direction is 50 μm.

The gap between the via 133 and the circular column part 134A of the grounded conductor 134 in the X-axis direction is 10 μm. The diameter of the via 133 is 15 μm. The diameter of the circular column parts 134A is 20 μm. The width of the coupling part 134B in the X-axis direction is 30 μm. The gap between the wiring layer 132 and the coupling part 134B in the Z-axis direction is 10 μm.

Furthermore, as illustrated in FIG. 3, the width of the wiring layer 114 in the Y-axis direction is 23 μm. The width of the wiring layer part 132C in the Y-axis direction is 20 μm and the length in the X-axis direction is 20 μm. The width of the wiring layer part 132B in the Y-axis direction is 25 μm and the length in the X-axis direction is 37.5 μm. The width of the main conductor part 132A in the Y-axis direction is 140 μm. The wiring layer 114, the main conductor part 132A, and the wiring layer parts 132B and 132C are disposed in such a manner that the centers of the widths of all in the Y-axis direction correspond with each other (central axes correspond with each other). Moreover, as illustrated in FIG. 5, the pitch between the circular column parts 134A adjacent to each other (interval between central axes) is 25 μm.

The thickness of the grounded layer 112, the wiring layer 114, the grounded layer 131, and the wiring layer 132 is 0.5 μm.

In the electronic device 100, the line width of the main conductor part 132A of the wiring layer 132 is set large in order to reduce the power transmission loss in the main conductor part 132A. To keep predetermined impedance (here, 50 Q) steady in a microstrip line, it is preferable to set the gap between the grounded layer and the wiring layer large if the line width of the wiring layer becomes large.

Incidentally, in a general liquid photosensitive material like solder resist, for example, the dielectric loss tangent is as high as 0.087 at 300 GHz. Therefore, it is difficult to set the thickness large as in the insulating layer 130 (50 μm). For this reason, if the liquid photosensitive material is used for the insulating layer 130, it becomes difficult to set the line width of the main conductor part 132A large.

Then, in the electronic device 100, the thickness of the insulating layer 130 is set large by using a film-shaped non-photosensitive material with which the dielectric loss tangent is low and increase in the thickness is easy for the insulating layer 130. Furthermore, a configuration is employed in which the line width of the main conductor part 132A is set large corresponding to the increase in the thickness of the insulating layer 130 and the power transmission loss in the main conductor part 132A may be greatly reduced.

Here, description will be made regarding a form in which the set of the wiring layer 114 and the grounded layer 112, the set of the via 133 and the grounded conductor 134 and the via 115, the set of the wiring layer 132 and the grounded layer 131, and the set of the wiring layer 132 and the grounded conductor 134 each constitute a microstrip line. The characteristic impedances of these four microstrip lines are all 50 Q. However, 50 Q is a designed value or theoretical value and possibly the actual characteristic impedance of each microstrip line slightly deviates from 50 Q. Such deviation possibly occurs due to a manufacturing error, another factor, or the like. However, including such a case, the characteristic impedances of the four microstrip lines are treated as being substantially equal at 50 Q. That the characteristic impedances are substantially equal to each other represents such meaning.

Figure 6A:
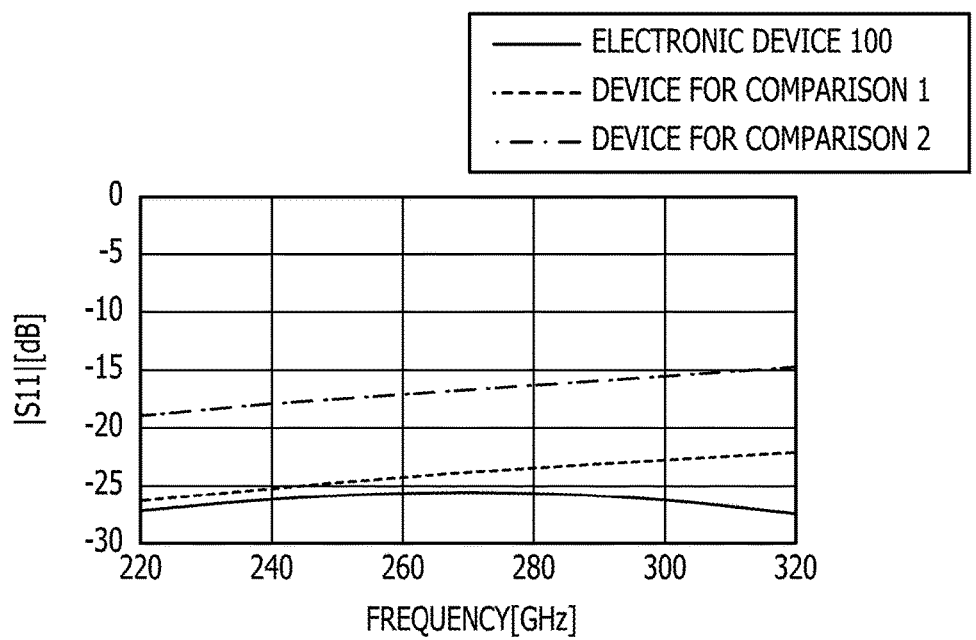
FIGS. 6A and 6B are diagrams illustrating a result of electromagnetic field analysis.
Figure 6B:
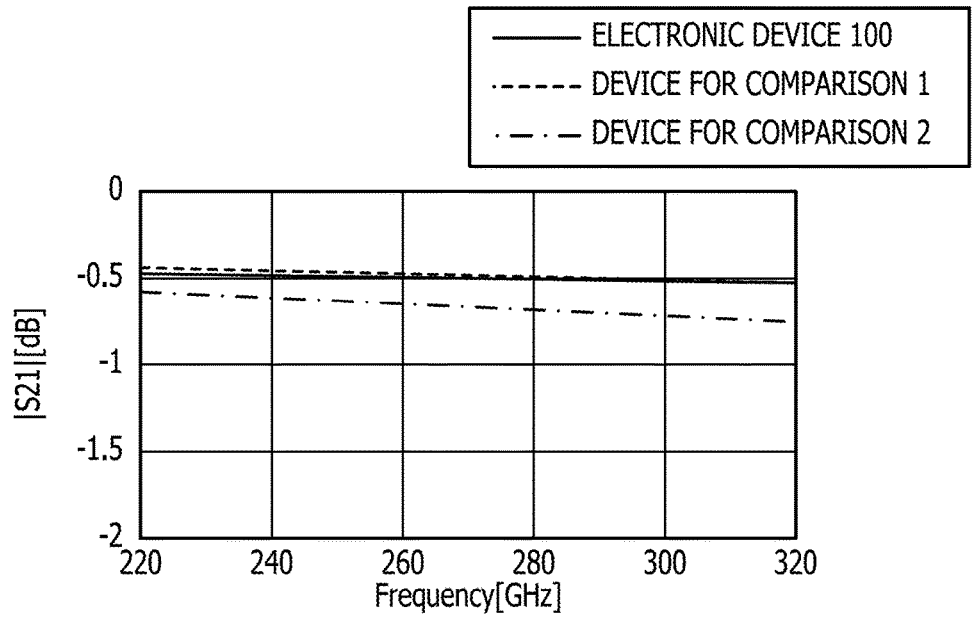

FIGS. 6A and 6B are diagrams illustrating a result of electromagnetic field analysis. The frequency characteristic of the S11 parameter is illustrated in FIG. 6A and the frequency characteristic of the S21 parameter is illustrated in FIG. 6B. The S11 parameter and the S21 parameter were obtained by the electromagnetic field analysis in such a manner that the wiring layer 114 and the grounded layer 112 were employed as port 1 and the wiring layer 132 and the grounded layer 131 were employed as port 2.

The thickness of the insulating layer 130 of the electronic device 100 of the embodiment was 50 µm and the line width of the main conductor part 132A of the wiring layer 132 was 140 µm. A film-shaped non-photosensitive material whose dielectric loss tangent was 0.025 at 300 GHz was used for the insulating layer 130.

Furthermore, for comparison, two electronic devices (hereinafter, referred to as devices 1 and 2 for comparison) were prepared. In device 1 for comparison, the thickness of the insulating layer 130 was set to 10 µm and the line width of the main conductor part 132A was set to 25 µm, and a film-shaped non-photosensitive material whose dielectric loss tangent was 0.025 (300 GHz) was used for the insulating layer 130. In device 2 for comparison, the thickness of the insulating layer 130 was set to 10 µm and the line width of the main conductor part 132A was set to 23 µm, and a liquid photosensitive material whose dielectric loss tangent was 0.087 (300 GHz) was used for the insulating layer 130. Devices 1 and 2 for comparison did not include the grounded conductor 134.

As illustrated in FIG. 6A, the frequency characteristic of the S11 parameter (reflection characteristic) was—25 dB or lower, which was the lowest, in the electronic device 100. In device 1 for comparison, the reflection characteristic was—25 dB or higher when the frequency was approximately 240 GHz or higher and had a tendency to increase along with the rise of the frequency. Furthermore, in device 2 for comparison, the reflection characteristic was approximately—18 dB to approximately—15 dB and had a tendency to increase along with the rise of the frequency.

As illustrated in FIG. 6B, the frequency characteristic of the S21 parameter (transmission characteristic) was approximately—0.5 dB in the electronic device 100. Also in device 1 for comparison, the transmission characteristic was approximately—0.5 dB, which was a value equivalent to that of the electronic device 100. Furthermore, in device 2 for comparison, the transmission characteristic was approximately—0.6 dB to approximately—0.75 dB and had a tendency to decrease along with the rise of the frequency.

As described above, both the reflection characteristic and the transmission characteristic were favorable in the electronic device 100 compared with devices 1 and 2 for comparison.

Next, a manufacturing method of the electronic device 100 will be described. FIGS. 7A to 7D and FIGS. 8A and 8B are diagrams illustrating manufacturing steps of the electronic device 100.

Figure 7A:
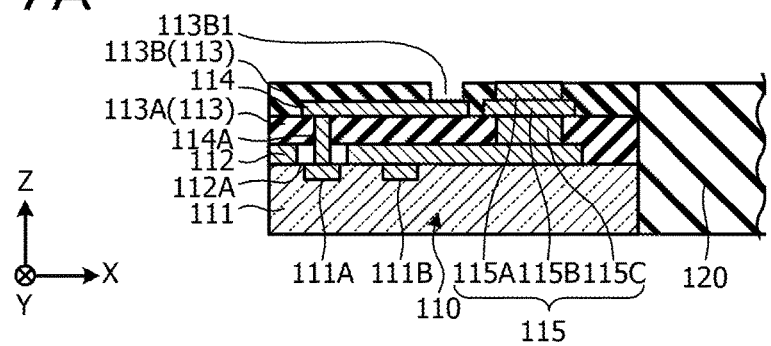
FIGS. 7A to 7D are diagrams illustrating manufacturing steps of an electronic device.

First, as illustrated in FIG. 7A, the semiconductor device 110 to which the mold resin 120 is joined is prepared. The semiconductor device 110 and the mold resin 120 illustrated in FIG. 7A are obtained by arranging the plural semiconductor chips 110 and reconstructing the semiconductor chips 110 into a wafer shape by the mold resin 120 and then turning the wafer into individual pieces again. The mold resin 120 is fabricated by carrying out heating treatment with use of a mold corresponding to the shape of the wafer in the state in which the plural semiconductor chips 110 are arranged and carrying out turning into the individual pieces. Incidentally, in the insulating layer 113B, an opening 113B1 for forming the lower end of the via 133 later is made.

Figure 7B:
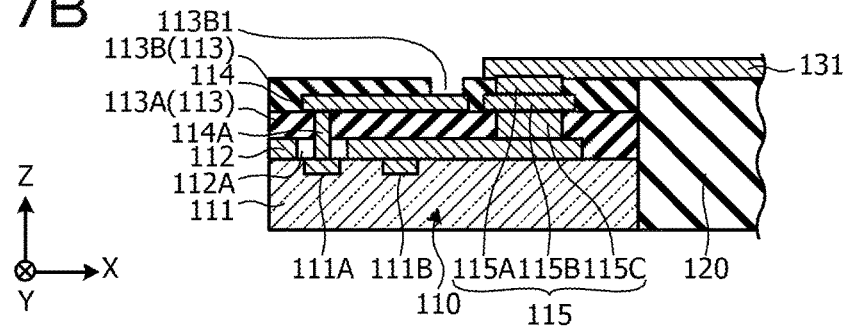

Next, as illustrated in FIG. 7B, the grounded layer 131 is formed on the mold resin 120. The lower surface of the end part of the grounded layer 131 on the X-axis negative direction side is joined to the via 115A. The grounded layer 131 is formed as follows, for example. A seed layer for electrolytic plating is formed on the mold resin 120 by a sputtering method. Then, a resist is formed on the seed layer, and the resist is patterned into the shape of the grounded layer 131. Thereafter, electrolytic plating treatment is carried out and the resist and the unnecessary seed layer are removed.

Figure 7C:
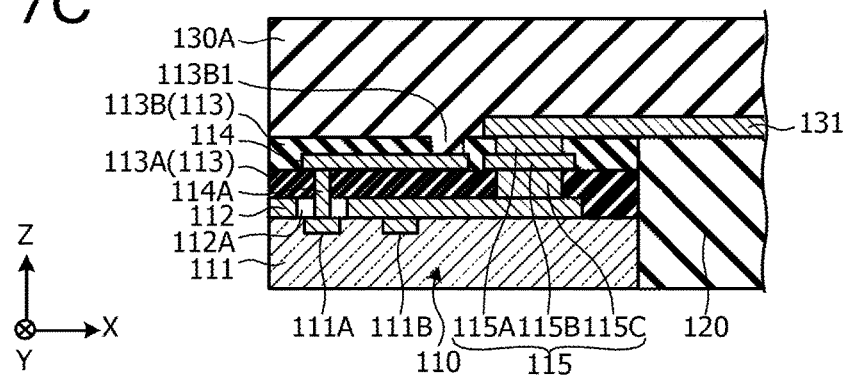

Next, as illustrated in FIG. 7C, an insulating layer 130A is formed. The insulating layer 130A is the part of the height to the upper end of the circular column parts 134A of the grounded conductor 134 in the insulating layer 130 illustrated in FIG. 1 to FIG. 5, and is one example of a first insulating layer. The insulating layer 130A is fabricated by sticking a film-shaped non-photosensitive material of a polyphenylene ether-based material by laminate processing and carrying out heat treatment to cure the film-shaped non-photosensitive material. At this time, the opening 113B1 is filled with the insulating layer 130A.

Next, via-holes for forming a via 133A and the plural circular column parts 134A are formed in the insulating layer 130A and a seed layer for electrolytic plating is formed inside the via-holes and on the upper surface of the insulating layer 130A by a sputtering method. Then, a resist is formed on the seed layer on the upper surface of the insulating layer 130A and electrolytic plating treatment is carried out. Thereby, the via 133A, the circular column parts 134A, and the coupling part 134B are fabricated. It is possible to fabricate the via-holes by processing the insulating layer 130A by using an excimer laser, for example.

Figure 7D:
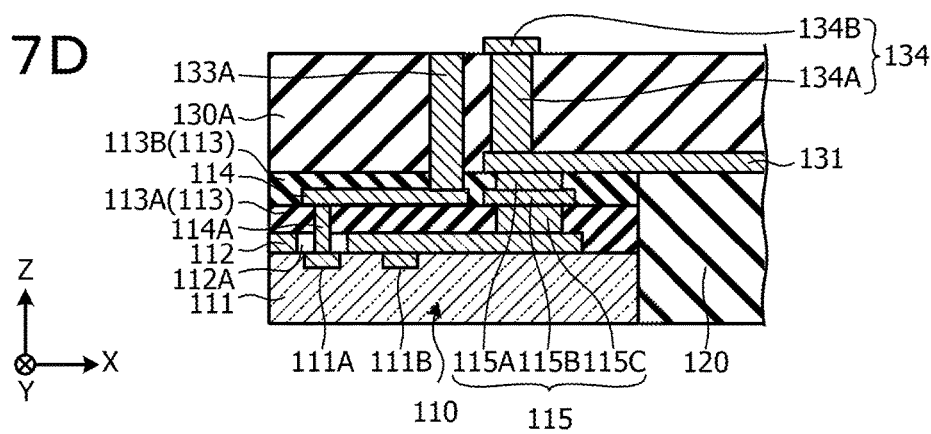

Then, by removing the resist and the seed layer over the upper surface of the insulating layer 130A, a structure illustrated in FIG. 7D is obtained. The circular column parts 134A are fabricated by a manufacturing method of so-called vias. Here, the via 133A is the part of the same height as the circular column parts 134A in the via 133 illustrated in FIG. 1 to FIG. 5.

Figure 8A:
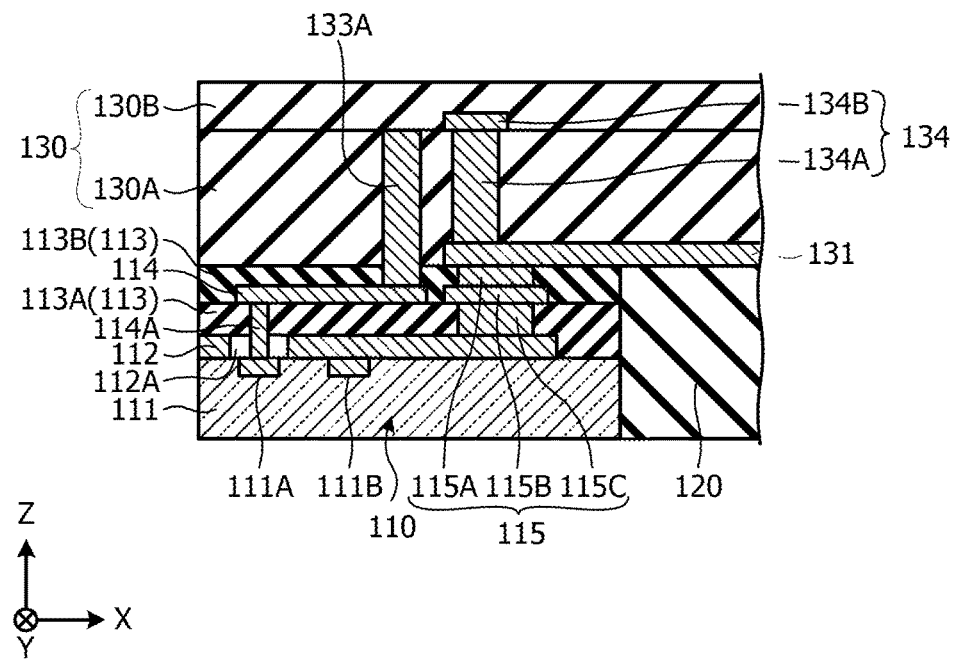
FIGS. 8A and 8B are diagrams illustrating manufacturing steps of an electronic device.

Next, as illustrated in FIG. 8A, an insulating layer 130B is formed on the insulating layer 130A, the via 133A, and the coupling part 134B of the structure illustrated in FIG. 7D. The insulating layer 130B can be formed by the same material and similar method as the insulating layer 130A. The total thickness of the insulating layer 130B and the insulating layer 130A is substantially equal to the thickness of the insulating layer 130 illustrated in FIG. 1 to FIG. 5. The insulating layer 130B is one example of a second insulating layer.

Figure 8B:
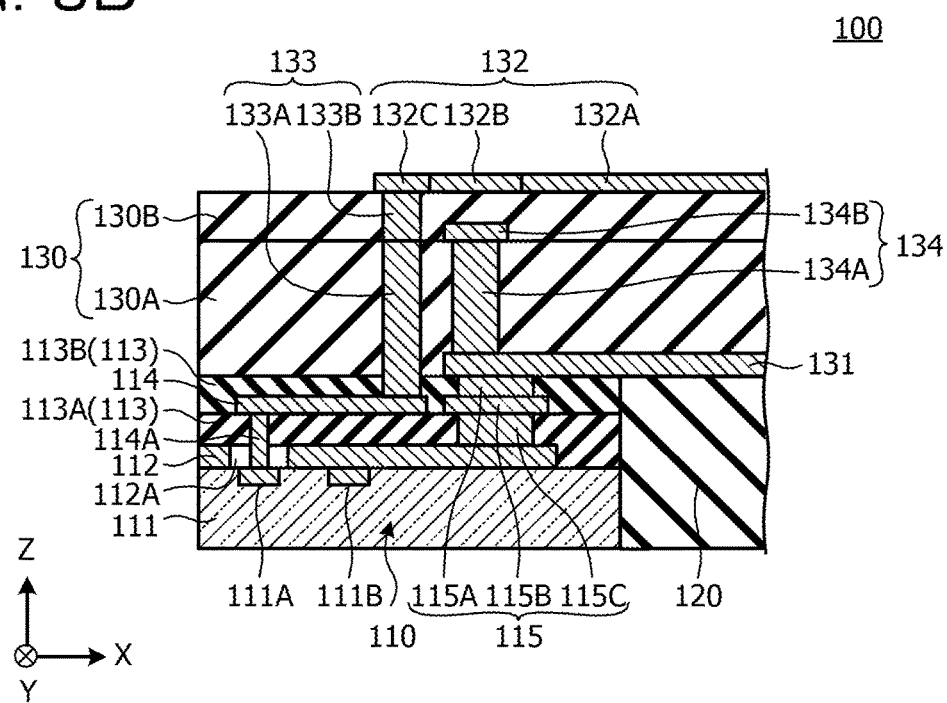

Next, a via-hole that reaches the upper end of the via 133A is formed in the insulating layer 130B and a seed layer for electrolytic plating is formed inside the via-hole and on the surface of the insulating layer 130B by a sputtering method. Then, a resist is formed on the seed layer and the resist is patterned into the shape of the wiring layer 132. Thereafter, electrolytic plating treatment is carried out and the resist and the unnecessary seed layer are removed. Thereby, as illustrated in FIG. 8B, a via 133B and the wiring layer 132 (main conductor part 132A and wiring layer parts 132B and 132C) are fabricated. It is possible to fabricate the via-hole by processing the insulating layer 130B by using an excimer laser, for example.

The electronic device 100 is completed by carrying out the above steps.

Figure 9:
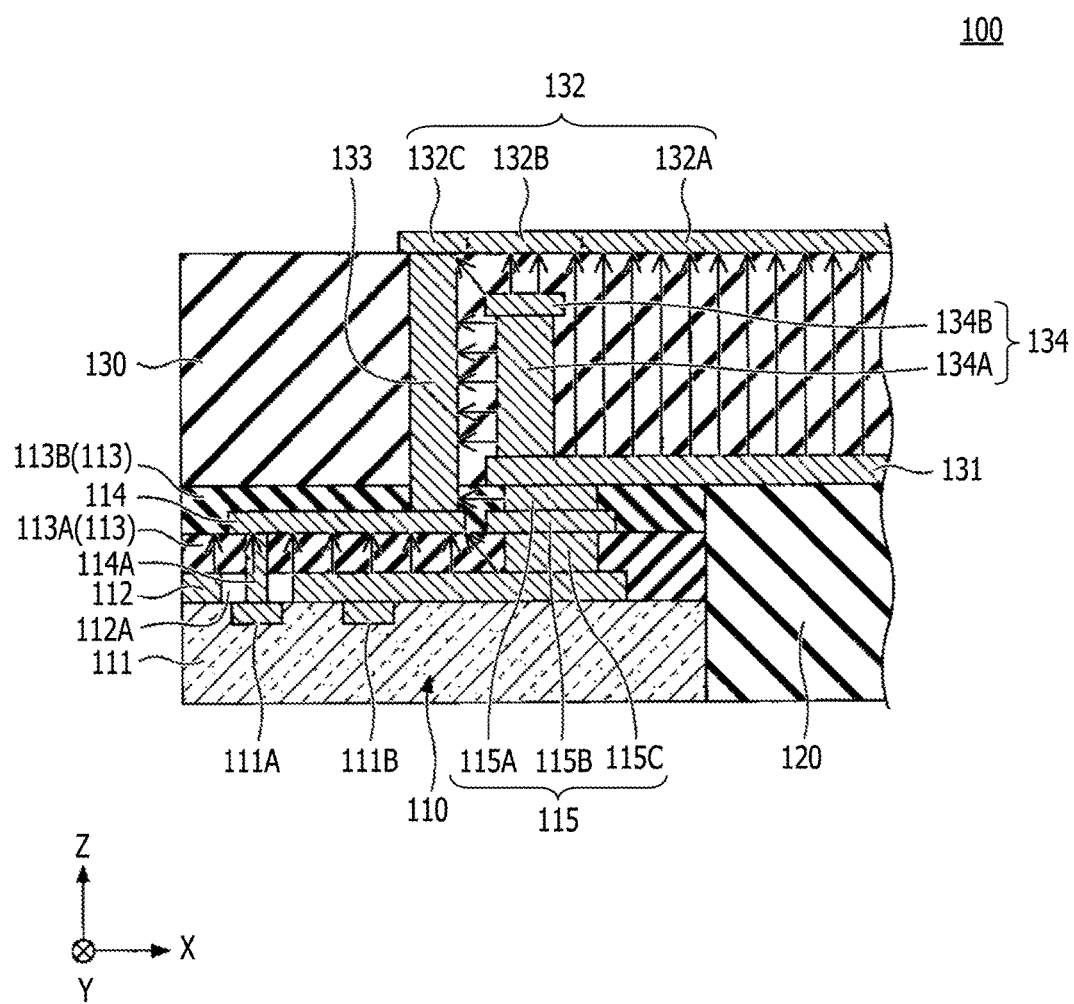
FIG. 9 is a diagram for explaining an electric field distribution of an electronic device.

FIG. 9 is a diagram for explaining an electric field distribution of the electronic device 100. In FIG. 9, the directions of the electric field are represented by arrows. In the electronic device 100, the wiring layer 114 constitutes a microstrip line with the grounded layer 112 and the main conductor part 132A of the wiring layer 132 constitutes a microstrip line with the grounded layer 131.

In order to set the line width of the main conductor part 132A large to reduce the power transmission loss, a film-shaped non-photosensitive material with which the dielectric loss tangent is low and increase in the thickness is easy is used as the insulating layer 130 to allow the insulating layer 130 to include a large thickness.

When the thickness of the insulating layer 130 is set large as above, the via 133 becomes long in the Z-axis direction. Therefore, it is desirable to improve the characteristic impedance of the via 133. Furthermore, it is also desirable to improve the characteristic impedance of the wiring layer parts 132B and 132C of the wiring layer 132.

Then, in the electronic device 100, the grounded conductor 134 that extends in the Z-axis direction is made along the via 133.

The via 133 constitutes a microstrip line with the grounded conductor 134 and the via 115. The part higher than the grounded conductor 134 in the via 133 also obtains the distribution of the electric field like that represented by an oblique arrow and constitutes the microstrip line with the grounded conductor 134. Furthermore, the part on the lower side in the via 133 also constitutes the microstrip line with the via 115A and the coupling part 115B.

Furthermore, the wiring layer parts 132B and 132C of the wiring layer 132 constitute a microstrip line with the coupling part 134B (grounded conductor 134). Also between the wiring layer part 132C and the coupling part 134B, the distribution of the electric field like that represented by the oblique arrow is obtained and the microstrip line is constituted.

Moreover, also between the coupling part 115B and the via 115C and the wiring layer 114, the distribution of the electric field like that represented by the oblique arrow is obtained and a microstrip line is constituted.

As above, in the electronic device 100, the wiring layer 114, the via 133, the wiring layer 132, the grounded layer 112, the via 115, the grounded conductor 134, and the grounded layer 131, which constitute the microstrip lines, are coupled to the semiconductor device 110.

Therefore, according to the embodiment, the electronic device 100 having favorable operation characteristics and a manufacturing method of the electronic device 100 may be provided.

Furthermore, the line width of the main conductor part 132A of the wiring layer 132 is expanded to such an extent that the power transmission loss may be sufficiently reduced even in a case where high-frequency power of several hundreds of GHz or higher flows.

Moreover, the electronic device 100 uses the film-shaped non-photosensitive material whose dielectric loss tangent is low as the insulating layer 130. Thus, the thickness of the insulating layer 130 may be set large. As a result, the line width of the main conductor part 132A of the wiring layer 132 may be set large and the power transmission loss may be sufficiently reduced.

In a hyper-high-frequency signal like one whose frequency surpasses 300 GHz, the wavelength is 1 mm or shorter. Considering the dielectric constant of the insulating layer 130 or the like, the length of ½₀ wavelength is 30 μm or shorter. For this reason, it is difficult to ignore the length of the via 133 (50 μm or slightly longer) and it is preferable to carry out impedance matching.

From such a viewpoint, the electronic device 100 is provided with a configuration in which the grounded conductor 134 that extends along the via 133 is made and the via 133 constitutes a microstrip line. By such a configuration, a coupling structure of low loss is implemented.

In the above, description is made regarding the form in which the semiconductor device 110 includes the grounded layer 112, the insulating layer 113 (113A and 113B), and the wiring layer 114 made over the semiconductor chip 111. However, the semiconductor device 110 may further include other wiring layers or grounded layers.

Furthermore, the mold resin 120, the insulating layer 130, the grounded layer 131, and the wiring layer 132 may further extend in the X-axis positive direction and the grounded layer 131 and the wiring layer 132 may be coupled to another electronic apparatuses, electronic components, or the like, which is not diagrammatically represented.

Moreover, in the above, the form in which the via 115 couples the grounded layer 131 and the grounded layer 112 is described. However, in a case where the characteristic impedance at the end part of the wiring layer 114 on the X-axis positive direction side is not affected, the via 115 does not have to be made and the grounded layer 131 may be held at the ground potential by a different measure.

In addition, in the above, the form in which the grounded conductor 134 includes the plural circular column parts 134A and the coupling part 134B is described. However, the grounded conductor 134 may have any shape as long as the grounded conductor 134 may constitute a microstrip line with the via 133 and the wiring layer parts 132B and 132C.

Furthermore, in the above, the form in which the grounded layer 131 is made between the semiconductor device 110 and the insulating layer 130 is described. However, the grounded layer 131 may be made inside the insulating layer 130. The inside of the insulating layer 130 is a position vertically sandwiched by the insulating layer 130 in the thickness direction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device comprising:
   a semiconductor device including a semiconductor chip, a first grounded layer formed on a surface of the semiconductor chip, and a first wiring layer that constitutes a first transmission line that has a predetermined characteristic impedance with the first grounded layer;
   a mold resin arranged on a side of the semiconductor device;
   an insulating layer arranged over the semiconductor device and the mold resin;
   a second grounded layer formed between the semiconductor device and the insulating layer, and the resin mold and the insulating layer;
   a second wiring layer formed over the insulating layer and includes
   a first area disposed at a part overlapping with the second grounded layer and
   a second area disposed on a side of an end part of the second grounded layer, the first area including a first line width and constituting a second transmission line including a predetermined characteristic impedance equal to the characteristic impedance of the first transmission line with the second grounded layer, the second area including a second line width smaller than the first line width;
   a via that couples the first wiring layer and the second area of the second wiring layer; and
   a grounded conductor formed inside the insulating layer at a position overlapping with the second area of the second wiring layer and includes a larger width than the second area in a line width direction of the second area, the grounded conductor extending from the second grounded layer to a position short of the second area along the via,
   wherein
   the via constitutes a third transmission line that has a predetermined characteristic impedance equal to the characteristic impedance of the first transmission line with the grounded conductor, and
   the second area of the second wiring layer constitutes a fourth transmission line that has a predetermined characteristic impedance equal to the characteristic impedance of the first transmission line with the grounded conductor.

2. The electronic device according to claim 1, wherein the grounded conductor includes
   a plurality of columnar parts that each have one end coupled to the second grounded layer and are disposed in the line width direction, and
   a coupling conductor that extends in the line width direction and couples the other ends of the plurality of columnar parts.

3. The electronic device according to claim 1, wherein the second grounded layer is coupled to the first grounded layer.

4. The electronic device according to claim 1, wherein the semiconductor device further includes
   a chip insulating layer made on the first surface of the semiconductor chip, and
   a protective insulating layer that covers the first wiring layer,
   the first grounded layer is made between the semiconductor chip and the chip insulating layer, and
   the first wiring layer is disposed to be overlaid on the chip insulating layer.

5. The electronic device according to claim 1, wherein the first transmission line, the second transmission line, the third transmission line, and the fourth transmission line are microstrip lines.

6. A manufacturing method of an electronic device, comprising:
   stacking a second grounded layer on a semiconductor device including a semiconductor chip, a first grounded layer formed on a surface of the semiconductor chip, and a first wiring layer that constitutes a first transmission line that has a predetermined characteristic impedance with the first grounded layer;
   forming a first insulating layer overlaid on the semiconductor device and the second grounded layer;
   forming a grounded conductor that has one end coupled to an end part of the second grounded layer and penetrates the first insulating layer in a thickness direction, the grounded conductor including a larger width than the first wiring layer;
   forming a second insulating layer overlaid on the first insulating layer;
   forming a via that has one end coupled to the first wiring layer and penetrates the first insulating layer and the second insulating layer in the thickness direction, the via extending along the grounded conductor and having the other end that appears outward from the second insulating layer; and
   forming a second wiring layer that is overlaid on the second insulating layer and includes a first area disposed at a part overlapping with the second grounded layer and a second area disposed at a position overlapping with the grounded conductor on a side of the end part of the second grounded layer, the first area including a first line width and constituting a second transmission line including a predetermined characteristic impedance equal to the characteristic impedance of the first transmission line with the second grounded layer, the second area including a second line width smaller than the first line width and width of the grounded conductor and being coupled to the via,
   wherein
   the via constitutes a third transmission line including a predetermined characteristic impedance equal to the characteristic impedance of the first transmission line with the grounded conductor, and
   the second area of the second wiring layer constitutes a fourth transmission line including a predetermined characteristic impedance equal to the characteristic impedance of the first transmission line with the grounded conductor.

* * * * *